United States Patent
Cross

(10) Patent No.: US 6,563,289 B1
(45) Date of Patent: *May 13, 2003

(54) SOLAR CELL ARRANGEMENTS

(75) Inventor: Trevor Arthur Cross, Chelmsford (GB)

(73) Assignee: EEV Limited, Essex (GB)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 188 days.

(21) Appl. No.: 09/387,760

(22) Filed: Sep. 1, 1999

(30) Foreign Application Priority Data

Sep. 4, 1998 (GB) .............................................. 9819260

(51) Int. Cl.$^7$ .................................................. H02J 7/00

(52) U.S. Cl. ....................................... 320/101; 136/256

(58) Field of Search ......................... 320/101; 136/244, 136/249, 255, 256

(56) References Cited

U.S. PATENT DOCUMENTS

| 4,356,341 A | * | 10/1982 | Borden et al. | ............... 136/249 |
| 4,481,378 A | | 11/1984 | Lesk | ............... 136/244 |
| 4,487,989 A | | 12/1984 | Wakefield et al. | ............... 136/256 |
| 4,846,896 A | * | 7/1989 | Hokuyo | ............... 136/255 |
| 5,567,248 A | | 10/1996 | Chung | ............... 136/244 |
| 6,034,322 A | * | 3/2000 | Pollard | ............... 136/256 |

FOREIGN PATENT DOCUMENTS

GB 2206732 11/1989

* cited by examiner

Primary Examiner—Edward H. Tso
Assistant Examiner—Lawrence Luk
(74) Attorney, Agent, or Firm—Donald C. Casey, Esq.

(57) ABSTRACT

In a solar cell arrangement, a generally rectangular solar cell has mutually orthogonal sides in plan view and a third oblique side to them which adjoins them. A protection diode is located in the region bounded by the third side and projections of the first and second sides. The protection diode is electrically connected to the solar cell. Use of the invention enables protection to be provided individual solar cells of a solar cell array without a significant loss in the area occupied by the light sensitive solar cell surfaces.

17 Claims, 2 Drawing Sheets

SOLAR CELL ARRANGEMENTS

FIELD OF THE INVENTION

This invention relates to solar cell arrangements and more particularly to the protection of solar cells against reverse current through them.

BACKGROUND TO THE INVENTION

In one type of solar cell (or photovoltaic cell), a voltage is developed across a p-n junction in a semiconductor when it is irradiated by photons. A plurality of solar cells may be connected together in an array to provide a power supply, such arrangements commonly being used in spacecraft and satellites for example. During operation, there may be circumstances where a single solar cell is shadowed or is faulty, and therefore not producing power, whilst the remainder of a string of cells with which is connected in series is illuminated and producing power. This may lead to current being driven in reverse through the shadowed solar cell. Power is dissipated within the cell which is proportional to the reverse voltage across it. If the power density is sufficiently high, the cell may irreversibly break down.

One way in which this problem may be alleviated is to use a protection diode wired across one or several solar cells in reverse parallel with them. If one of the cells across which it is connected is driven into reverse bias, the protection diode diverts current from the cell. This limits the power dissipation in the shadowed cell by both limiting the voltage across the shadowed cell and by passing the reverse current.

SUMMARY OF THE INVENTION

The present invention seeks to provide an improved solar cell arrangement which is particularly advantageous when applied to GaAs solar cells and cascade solar cells, although other types of solar cell may also benefit from it.

According to the invention there is provided a solar cell arrangement comprising: a solar cell which in plan view has substantially mutually orthogonal first and second sides with a third side between them; and a protection diode electrically connected to the solar cell and located next to the solar cell in a region bounded by the third side and projections of the first and second sides.

Use of the invention enables each solar cell in an array to be protected individually. As the protection diode is located to the side of the solar cell, no special coverglass configuration is required and conventional automatic glassing and interconnecting equipment may be used. This is particularly attractive to users who acquire cells for later incorporation into an array as the array may be assembled without needing to give special consideration to protection of the cells or modifying the assembly process. Use of the invention also allows the solar cell arrangement to be mounted on a panel in a conventional manner as may be no more fragile than a cell which does not incorporate diode protection and the cell also has a substantially conventional profile.

By using the invention, it possible for a solar cell to have its own dedicated protection diode without appreciably increasing the overall area required to accommodate it, which is particularly advantageous where the cell is included in an array. The diode is located in a region which might otherwise be taken up by part of the solar cell itself. This may lead to a loss of active solar cell area. However, in some cases, the diode may be included without any loss in the area occupied by the solar cell and still take advantage of the invention. For example, where a solar cell is manufactured from a circular wafer forming the substrate on which the p-n junction is fabricated, the cell dimensions are sometimes sufficiently large in comparison that a regular, rectangular solar cell cannot be derived from the wafer without two of the corners being lost. In this case, the protection diode may advantageously be located in one of the cropped corners of the otherwise rectangular solar cell.

The diode is conveniently of triangular cross section in plan view where the solar cell has a straight third side extending between first and second sides so as to fit in the triangular region so defined. However, the diode could be other shapes, for example, of circular or square cross section. It is preferred that the diode is wholly located in the region bounded by the third side and projections of the first and second sides. This facilitates integration of the solar cell arrangement into an array where it is mounted closely spaced from adjacent arrangements and interconnected therewith. However, the diode could be slightly larger than the region and still offer advantages over conventional arrangements.

In a preferred embodiment of the invention, the third side joins the first and second sides and is oblique to them. As mentioned above, this configuration of cell sometimes occurs in any case in conventional cells because of the processing techniques used. However, in another embodiment, the third side comprises two orthogonal straight edges to define a square notch at a corner of the solar cell. This is more difficult to cut in practice, however, and is thus not preferred.

The diode is preferably a silicon diode. The characteristics of such a diode can be particularly well controlled and made compatible with the requirements of the solar cell. In another embodiment, the diode is of the same material as the solar cell active material. For example, it may be an off-cut from the solar cell itself connected across the solar cell such that its p-n junction is in reverse to that of the solar cell.

The invention is particularly applicable to solar cell arrangements where the solar cell is a GaAs solar cell. GaAs cells are particularly vulnerable, tending to break down at lower reversible voltages than silicon solar cells, for example. Previously, some users of GaAs solar cells have pre-screened them prior to incorporating them in an array to eliminate those which are more likely to be break down in use. By using the invention, it is no longer necessary to carry out a pre-screening procedure saving time and expense, and also improving yield in manufacturing the cells. The invention is also applicable to cascade solar cells, also known as tandem solar cells. A cascade solar cell is one which includes two p-n junctions connected in series internally by a tunnel junction or some other means. The front p-n junction produces voltage in response to incident radiation of a relatively short wavelength and the rear p-n junction is tailored for longer wavelengths.

The solar cell in plan view may be rectangular or square except for a corner or corners which are cropped and in one of which the protection diode is located. The protection diode is in one embodiment mounted on the solar cell. This may be achieved, for example, by using a non-conductive adhesive to fix it to the side of the solar cell or by applying a bead of epoxy to join the diode to the back contact of the cell. In an alternative embodiment, which is more appropriate where thermal cycling during use is envisaged, the protection diode is spaced from the solar cell. The solar cell and protection diode may be electrically and mechanically connected by an interconnect or interconnects which are configured to allow for differential thermal expansion. The normally provided coverglass located on the front surface of the solar cell may be extended to project over the diode also, although this is not essential.

According to a first feature of the invention, a solar cell array comprises a plurality of solar cell arrangements in accordance with the invention. The invention enables the solar cell arrangements to be located close to one another, maximizing the area available for reception of incident radiation and generation of power.

According to a second feature of the invention, a solar cell array comprises a plurality of solar cell arrangements, each arrangement comprising a solar cell which in plan view has substantially mutually orthogonal first and second sides with a third side between them; and a protection diode located next to the solar cell in a region bounded by the third side and projections of the first and second sides and electrically connected to an adjacent solar cell.

By employing this second feature, the advantage of providing a dedicated protection diode for each solar cell in an array is maintained as is the compact arrangement which results from use of the invention. The protection diode may be fixed mechanically to the solar cell prior to incorporation into the array and the electrical connections to the adjacent solar cell made following mounting the solar cell arrangements on a panel.

BRIEF DESCRIPTION OF DRAWINGS

Some ways in which the invention may be performed are now described by way of example with reference to the accompanying drawings in which.

DESCRIPTION OF PREFERRED EMBODIMENTS

Figure 1:
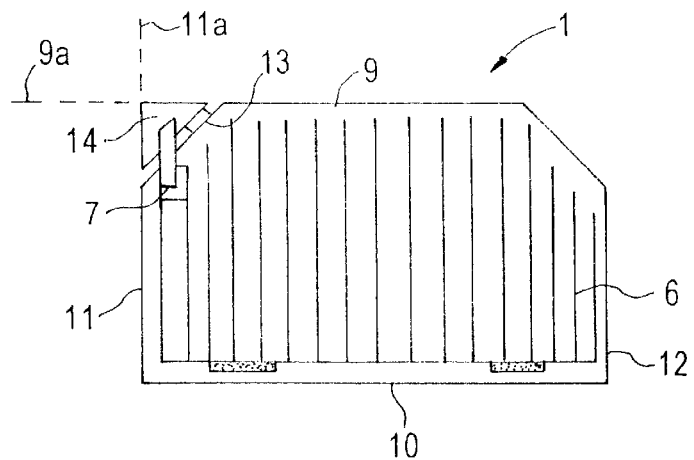
FIGS. 1 and 2 are plan and side views of a solar cell arrangement in accordance with the invention.
Figure 2:
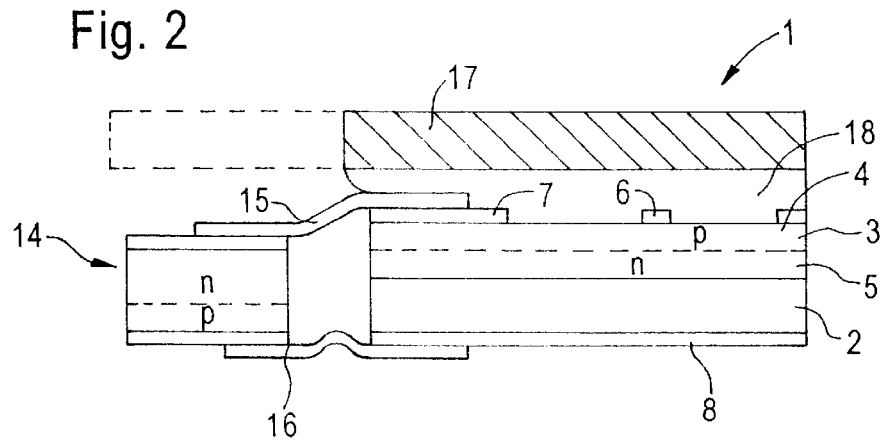

With reference to FIGS. 1 and 2, a solar cell 1 comprises a germanium substrate 2 on which is grown an expitaxial GaAs layer 3 doped to give p and n type layers 4 and 5 with a junction between them. A front metal contact grid 6 located on the GaAs layer 3 includes a supplementary pad 7. There is a rear metal layer 8 on the rear surface of the germanium substrate 2.

In plan view, the solar cell 1 is generally rectangular having a parallel sides 9 and 10, and sides 11 and 12 with two of the corners of the rectangle being cropped. At one of the cropped corners, a third oblique side 13 exists between the mutually orthogonal sides 9 and 11. In the region bounded by projections 9a of side 9 and 11a of side 11 and the oblique side 13, a silicon protection diode 14 is located. In this embodiment, the protection diode 14 is of triangular section in plan view. The diode 14 is electrically connected across the cell 1 by a front interconnect 15 to the supplementary pad 7 and by a back interconnect 16 to the rear metal layer 8, such that the n-contact of the diode is connected to the p layer 4 of the cell and its p contact to the n layer 5 of the cell. The interconnects are of molybdenum electroplated with gold and are shaped so that they accommodate any differential thermal expansion which may occur during use. The diode 14 is spaced from the solar cell by a gap of about 1 mm. A coverglass 17 (not shown in FIG. 1) bonded by adhesive 18 to the front surface of the solar cell 1. It may be larger than the solar cell 1 and extend over the diode 14 as shown by the dotted line.

Figure 3:
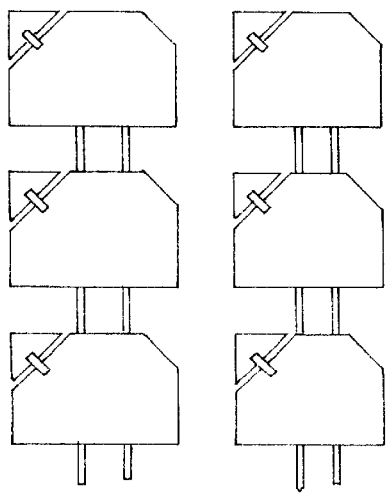
FIG. 3 schematically shows an array of solar cell arrangements.

FIG. 3 illustrates an array of solar cells arrangements each of which is such as that shown in FIG. 1. The array comprises a plurality of strings, two of which are shown, of solar cell arrangements connected in series, the strings being connected to give a power output, with the front of one cell being connected to the back of the adjacent cell and so on along a string. Each solar cell arrangement includes its own silicon protection diode located at a cropped corner. During use, if one of the solar cells enters shadow and develops a reverse voltage across it, the reverse current is diverted through its associated protection diode to by-pass the solar cell structure and hence protect it.

Figure 4A:
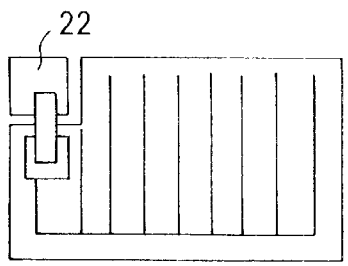
FIGS. 4a and 4b schematically show in side and plan view a cascade solar cell.
Figure 4B:
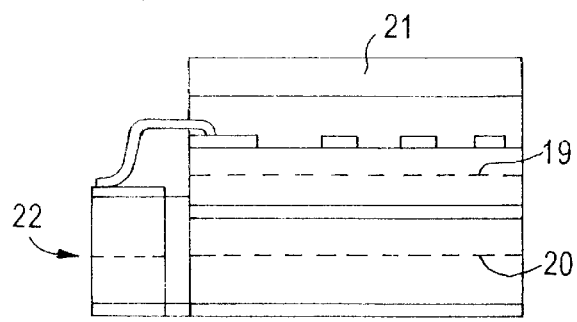

With reference to FIGS. 4a and 4b, the invention is also applicable to other types of solar cells such as a cascade solar cell. In this case, the solar cell includes two p n junctions 19 and 20, the front one of which 19 is responsive to shorter wavelength light and the rear junction 20 being responsive to longer wavelength light to which the front parts of the solar cell are transmissive. Again, a coverglass 21 protects the front surface of the solar cell. A silicon protection diode 22 is connected across both p n junctions to prevent reverse current from passing through the solar cell. The solar cell arrangement is shown in plan view in FIG. 4a where it can be seen that the diode 22 is located at a corner of the generally rectangular solar cell and in this case is of square cross section, with the third side of the solar cell between first and second mutually orthogonal sides being included as one of a pair of mutually orthogonal sides forming a notch in the corner of the solar cell. The diode 22 is bonded to the side of the solar cell by an electrically non-conductive adhesive.

Figure 5:
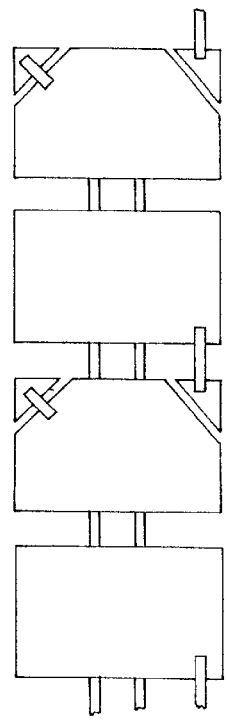
FIGS. 5 and 6 schematically show respective different solar cell arrangements in accordance with the invention.

FIG. 5 illustrates schematically an array of solar cell arrangements in accordance with the invention. In this array, two types of solar cell arrangements are included. A first set includes two cropped corners with a protection diode being located in each cropped corner. These are connected alternately in series with solar cells having a regular rectangular shape in plan view. Each solar cell with two diodes has one diode which is connected to it and the other diode is connected to an adjacent regular rectangular solar cell.

Figure 6:
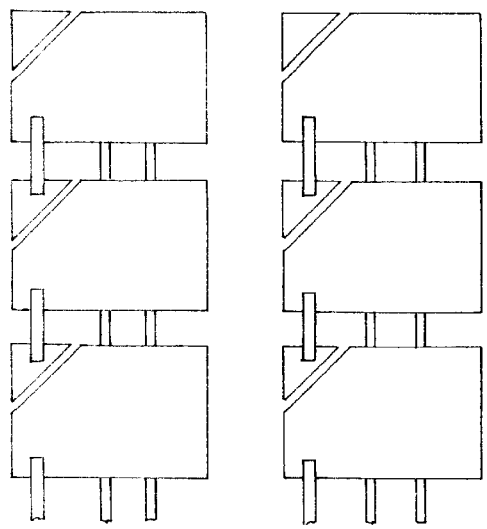

In FIG. 6, another embodiment is shown in which each solar cell arrangement includes a protection diode located in a region at its corner and in each case the protection diode is connected to an adjacent solar cell.

Although the arrangements of FIG. 5 and 6 have the advantage that protection diodes are located in regions closely adjacent to the solar cells and each solar cell has its own dedicated protection diode, these embodiments are less advantageous than that shown in FIG. 3 because the connections of the protection diodes to the solar cells are made during fabrication of the array and also the electrical connections involved are longer and hence may tend to be more fragile than those of the embodiment shown in FIG. 3.

I claim:

1. A solar cell arrangement comprising: a solar cell which in plan view has substantially mutually orthogonal first and second sides with a third side between them; and a protection diode electrically connected to said solar cell and located next to said solar cell in a region bounded by said third side and projections of said first and second side.

2. An arrangement as claimed in claim 1 wherein said diode is wholly located in said region.

3. An arrangement as claimed in claim 1 wherein said third side adjoins said first and second sides and is oblique to them.

4. An arrangement as claimed in claim 3 wherein said diode is wholly located in said region.

5. An arrangement as claimed in claim 1 wherein said diode is a silicon diode.

6. An arrangement as claimed in claim 1 wherein said diode is of the same material as the solar cell active material.

7. An arrangement as claimed in claim 1 wherein said solar cell is a GaAs solar cell.

8. An arrangement as claimed in claim 1 wherein said solar cell is a cascade solar cell.

9. An arrangement as claimed in claim 1 wherein said solar cell in plan view includes a fourth side and a fifth side parallel to said first side and said second side respectively.

10. An arrangement as claimed in claim 1 and including a coverglass mounted on said solar cell.

11. An arrangement as claimed in claim 10 wherein said coverglass covers said protection diode.

12. An arrangement as claimed in claim 1 wherein said protection diode is mounted on the side of said solar cell.

13. An arrangement as claimed in claim 1 wherein said protection diode is spaced from said solar cell.

14. An arrangement as claimed in claim 13 wherein an electrical interconnect between said protection diode and the solar cell is configured to allow for differential thermal expansion.

15. A solar cell array comprising a plurality of solar cell arrangements wherein each solar cell arrangement of the plurality comprises: a solar cell which in plan view has substantially mutually orthogonal first and second sides with a third side between them; and a protection diode electrically connected to said solar cell and located next to said solar cell in a region bounded by said third side and projections of said first and second side.

16. An array as claimed in claim 15 wherein the solar cell arrangements are connected as a plurality of strings.

17. A solar cell array comprising a plurality of solar cell arrangements, each arrangement comprising a solar cell which in plan view has substantially mutually orthogonal first and second side between them, and a protection diode located next to said cell in a region bounded by the third side and protections of the first and second sides and electrically connected to an adjacent solar cell.

\* \* \* \* \*